(12) United States Patent
Yama et al.

(10) Patent No.: US 9,130,081 B2
(45) Date of Patent: Sep. 8, 2015

(54) BOLOMETER HAVING ABSORBER WITH PILLAR STRUCTURE FOR THERMAL SHORTING

(71) Applicant: Robert Bosch GmbH, Stuttgart (DE)

(72) Inventors: Gary Yama, Mountain View, CA (US); Fabian Purkl, Palo Alto, CA (US); Ando Lars Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/109,936

(22) Filed: Dec. 17, 2013

(65) Prior Publication Data

US 2014/0175285 A1   Jun. 26, 2014

Related U.S. Application Data

(60) Provisional application No. 61/740,761, filed on Dec. 21, 2012.

(51) Int. Cl.
| | |
|---|---|
| *G01J 5/20* | (2006.01) |
| *H01L 31/0248* | (2006.01) |
| *H01L 31/18* | (2006.01) |
| *G01J 5/02* | (2006.01) |
| *H01L 31/09* | (2006.01) |

(52) U.S. Cl.
CPC ............. *H01L 31/0248* (2013.01); *G01J 5/024* (2013.01); *G01J 5/0245* (2013.01); *G01J 5/20* (2013.01); *H01L 31/09* (2013.01); *H01L 31/18* (2013.01)

(58) Field of Classification Search
CPC ......................................................... G01J 5/20
USPC ...................................................... 250/338.4
See application file for complete search history.

(56) References Cited

U.S. PATENT DOCUMENTS

| | | | |
|---|---|---|---|
| 8,047,710 B2 * | 11/2011 | Ikushima | ....................... 374/121 |
| 2004/0232337 A1 | 11/2004 | Vilain | |

OTHER PUBLICATIONS

International Search Report and Written Opinion corresponding to PCT Application No. PCT/US2013/076250, mailed Mar. 4, 2014 (11 pages).
Yoneoka et al., ALD-Metal Uncooled Bolometer, IEEE 24th International Conference on Micro Electro Mechanical Systems (MEMS 2011), Jan. 23, 2011, pp. 676-679 (4 pages).

* cited by examiner

*Primary Examiner* — David Porta
*Assistant Examiner* — Edwin Gunberg
(74) *Attorney, Agent, or Firm* — Maginot Moore & Beck LLP

(57) ABSTRACT

A semiconductor device includes a substrate having an electrode structure. An absorber structure is suspended over the electrode structure and spaced a first distance apart from the first electrode structure. The absorber structure includes i) suspension structures extending upwardly from the substrate and being electrically connected to readout conductors, and ii) a pillar structure extending downwardly from the absorber structure toward the first electrode structure. The pillar structure has a contact portion located a second distance apart from the first electrode structure, the second distance being less than the first distance. The absorber structure is configured to flex toward the substrate under a test condition. The second distance is selected such that the contact portion of the pillar structure is positioned in contact with the first electrode structure when the absorber structure is flexed in response to the test condition.

18 Claims, 2 Drawing Sheets

BOLOMETER HAVING ABSORBER WITH PILLAR STRUCTURE FOR THERMAL SHORTING

CROSS-REFERENCE TO RELATED APPLICATIONS

This application claims priority to U.S. Provisional Application Ser. No. 61/740,761 entitled "BOLOMETER HAVING ABSORBER WITH PILLAR STRUCTURE FOR THERMAL SHORTING" by Fabian Purkl et al., filed Dec. 21, 2012, the disclosure of which is hereby incorporated herein by reference in its entirety.

TECHNICAL FIELD

This disclosure relates generally to infrared radiation sensors, and in particular to bolometer infrared radiation sensors.

BACKGROUND

In general, infrared radiation (IR) sensors are used in a variety of applications to detect infrared radiation and provide an electrical output that is a measure of the incident infrared radiation. One type of infrared sensor is a bolometer. A bolometer typically includes an absorber element for absorbing infrared radiation and a transducer element that has an electrical resistance that varies with temperature. In operation, infrared radiation incident upon the bolometer is absorbed by the absorber element and transferred to the transducer element in the form of heat. The heat causes the electrical resistance of the transducer element to change in a manner that is proportional to the amount of infrared radiation incident on the absorber element. Therefore, by detecting changes in the electrical resistance, a measure of the incident infrared radiation can be obtained.

Heat transference between the absorber element and the substrate can result in heat losses and heat gains that can adversely impact the reliability and accuracy of the sensor. To minimize heat losses and heat gains, the absorber element and transducer element are typically incorporated into a suspension structure that is suspended above the surface of the substrate. By suspending the absorber element above the substrate, the possibilities of heat transference due to thermal contact with the substrate are minimized.

The reliability and accuracy of bolometer sensors may also be impacted by process variations and drift of material properties and other factors over time. Bolometer sensors also face the problem of Joule-heating. Joule-heating results when an electric current is passed through the transducer element to detect heat induced changes in the electrical resistance. The electric current generates heat in the transducer element which increases the temperature of the transducer element beyond the temperature resulting from heat transference from the absorber element.

Process variations, drift, Joule-heating, and other similar factors can introduce variations, such as drift and offset, into sensor output. Compensation values are often incorporated into the sensor output to compensate for deviations in sensor output due to drift and offset. The compensation values, however, are typically based on historical performance and test data from other sensors.

DRAWINGS

DESCRIPTION

Figure 1:
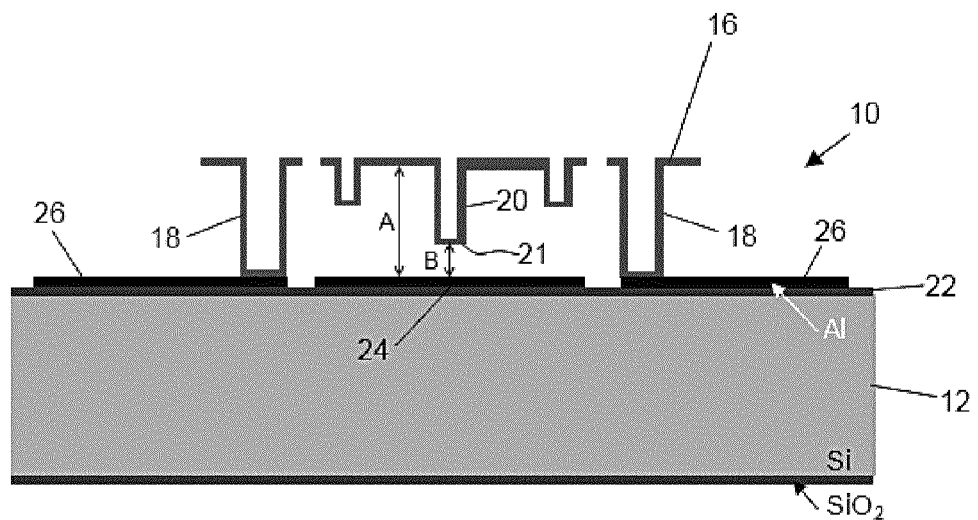
FIG. 1 is a cross-sectional view of a bolometer sensor having an absorber element with a pillar structure for contacting the substrate.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

The present disclosure is directed to a configuration for a bolometer infrared sensor that enables the absorber element of the sensor to be thermally shorted to the substrate by bringing a part of the absorber element into contact with the substrate in a controllable and selectable manner, e.g., by applying an actuating voltage. With such a sensor, a correlated double sampling of the sensor output can be easily performed by measuring the output of a sensor once with the sensor under the influence of infrared radiation alone and measuring the output of the sensor once without the influence of infrared radiation, by thermally shorting the absorber element to the substrate. By measuring the difference between the measured signal before and after thermal shorting, the output characteristics of the sensor can be determined and adjusted to compensate for possible variations, such as offset and drift. As a result, the offset and drift of the sensor output can be reduced so that accuracy and reliability of the sensor can be improved.

According to one embodiment, a semiconductor device includes a substrate having an electrode structure. An absorber structure is suspended over the electrode structure and spaced a first distance apart from the first electrode structure. The absorber structure includes i) suspension structures extending upwardly from the substrate and being electrically connected to readout conductors, and ii) a pillar structure extending downwardly from the absorber structure toward the first electrode structure. The pillar structure has a contact portion located a second distance apart from the first electrode structure, the second distance being less than the first distance. The absorber structure is configured to flex toward the substrate under a test condition, e.g., an actuation voltage applied to the electrode structure. The second distance is selected such that the contact portion of the pillar structure is positioned in contact with the first electrode structure when the absorber structure is flexed in response to the test condition.

In another embodiment, a method of operating a semiconductor device includes measuring a first electrical resistance in an absorber structure of a bolometer device formed on a substrate. The absorber structure is suspended over an electrode structure provided on an upper surface of the substrate and spaced a first distance apart from the electrode structure. The absorber structure includes i) suspension structures extending upwardly from the substrate and being electrically connected to readout conductors on the upper surface of the substrate, and ii) a pillar structure extending downwardly from the absorber structure toward the electrode structure. The pillar structure has a contact portion located a second distance apart from the first electrode structure, the second distance being less than the first distance. The absorber structure is configured to flex toward the substrate in response to a test condition, e.g., an actuation voltage applied to the electrode structure. The second distance is selected such that the contact portion of the pillar structure is positioned in contact with the electrode structure when the absorber structure is flexed in response to the test condition.

The first electrical resistance is measured with the contact portion of the pillar structure spaced apart from the electrode structure. The test condition is then applied to the absorber structure after the first electrical resistance is measured to cause the absorber structure to flex and bring the contact portion of the pillar structure into contact with the electrode structure. A second electrical resistance in the absorber structure is then measured while the contact portion of the pillar structure is contacting the electrode structure.

In yet another embodiment, a method of fabricating a semiconductor device includes depositing a sacrificial layer stack over a patterned conductive layer provided on a surface of a substrate. The patterned conductive layer includes an electrode structure. The sacrificial layer stack has an upper surface at a first distance above the electrode structure. The sacrificial layer stack is then patterned to include anchor holes that extend down from the upper surface of the layer stack to the patterned conductive layer. The sacrificial layer stack is also patterned to include a pillar hole that extends toward the electrode structure from the upper surface of the layer stack to a second distance apart from the electrode structure, the second distance being less than the first distance. A conductive material is then deposited onto the sacrificial layer stack to form an absorber structure. The conductive material is deposited so as to line the walls of the anchor holes to form suspension structures that support the absorber structure at the first distance and to line the walls of the pillar hole to form a pillar structure having a contact portion located at the second distance. The absorber structure is configured to flex toward the substrate in response to a test condition, e.g., an actuation voltage being applied to the electrode, to bring the contact portion of the pillar structure into contact with the electrode structure.

FIG. 1 depicts an embodiment of a bolometer sensor 10 in accordance with the present disclosure. Such a sensor is useful in a variety of applications including temperature sensors, IR sensors, IR sensor arrays, thermal imagers, night vision cameras, remote temperature sensing, and the like. The sensor 10 includes a substrate 12 and an absorber element 16. In the embodiment of FIG. 1, the substrate 12 comprises an oxidized silicon wafer. A conductive layer, e.g., aluminum, is formed on the surface of the substrate, or in this case, formed on a thin SiO2 layer 22 on the surface of the substrate 12. The conductive layer is patterned, e.g., by etching, to form a counter-electrode structure 24 and readout conductors 26. The readout conductors 26 are used to connect the sensor to readout circuitry (not shown).

The absorber element 16 includes anchoring structures 18 that are configured to support the absorber element 16 a predetermined distance A above the surface of the substrate 12. The absorber element also includes at least one pillar structure 20. The pillar structure 20 extends downwardly from the absorber element 16 and includes a substrate contact portion 21 that is arranged a second distance B from the substrate. The second distance B is configured to allow the pillar structure 20 to be brought into contact with the substrate 12 in response to an actuating voltage for correlated double sampling of the sensor output.

Figure 3:
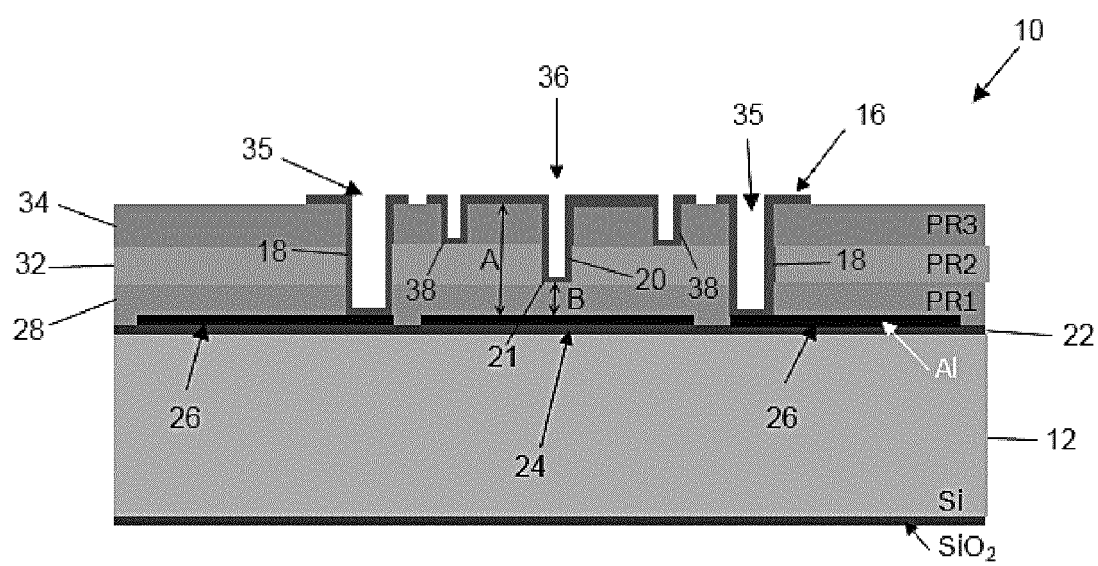
FIG. 3 is a cross-sectional view of the bolometer sensor of FIG. 1 prior to removal of the sacrificial layers.

In one embodiment, the configuration of the absorber element 16 with pillar structure 20 is defined by multiple photoresist layers that are deposited on the substrate such as described in FIG. 3. In FIG. 3, three photoresist layers 28, 32, 34 are deposited on the substrate 12, e.g., by spin-coating. The first photoresist layer 28 is deposited on the substrate 12 over the patterned conductive layer at a thickness that corresponds to the desired height of the contact portion of the pillar structure, i.e., the second distance B. The first photoresist layer 28 is then structured directly through lithography to form the lower portions of the anchoring holes 35 that will define the anchoring structures 18. After being structured, the first photoresist layer 28 can be made lithographically inactive, e.g., by baking the photoresist, before the next photoresist layer 30 is deposited.

The second photoresist layer 32 is then deposited on the first photoresist layer 28 and structured lithographically to form the intermediate portions of the anchoring holes 35 for defining the anchoring structures 18. The second photoresist layer 32 is also structure to define the lower portion of a pillar hole 36 that will define the pillar structure 20. After being structured, the second photoresist layer 32 is made lithographically inactive, e.g., by baking, before the next photoresist layer 34 is deposited.

After the second photoresist layer 28 has been structured and baked, the third photoresist layer 34 is deposited onto the second photoresist layer 32 and structured to form the upper portions of the anchor holes 35 and the pillar hole 36. The third photoresist layer may also be structured to produce additional features, such as trenches 38 that will be used to define folds in the absorber element 16 to add mechanical stability. The third photoresist layer is then made lithographically inactive, e.g., by baking, to allow the deposition of the absorber element 16.

The absorber element 16 for the sensor 10 is deposited onto the third photoresist layer 34 such that it conformally follows the contours of the anchor holes 35, pillar hole 36 and mechanical stability trenches 38. The absorber element 16 is formed of a suitable conductive material, such as platinum, or a combination of suitable conductive materials, deposited in any suitable manner. In one embodiment, the absorber structure 16 comprises a thin film structure deposited using an atomic layer deposition (ALD) process. The portions of the absorber 16 that are deposited into the anchor holes 35 form the anchor structures 18 and are electrically connected to the readout conductors 26 at the base of the anchor holes 35. The portion of the absorber 16 that is deposited into the pillar hole 36 forms the pillar structure 20.

In the embodiment of FIG. 3, the first, second and third layers 28, 32, 34 are deposited at a total thickness that corresponds to the desired spacing between the absorber element 16 and the substrate 12. This spacing can be tuned to a targeted infrared wavelength range (e.g. 8-14 um) to form a Fabry-Pérot cavity between the absorber and a reflector formed on the substrate to enhance absorption. In one embodiment, the actuation electrode 24 can simultaneously act as a reflector for the absorber 16. The thicknesses of the second photoresist layer 32 and the third photoresist layer 34 are selected based on the desired dimensions of the pillar structure 20 and mechanical stability features 38. As mentioned above, the thickness of the first photoresist layer 28 is selected based on the desired spacing between the contact portion 21 of the pillar structure 20 and the surface of the substrate 12. After the absorber element 16 has been deposited, the first, second, and third photoresist layers are removed to release the absorber element 16 and pillar structure 20 as depicted in FIG. 1.

As an alternative to using photoresist materials as described above, one or more sacrificial layers formed of materials, such as Si, SiO2, or polymer, may be deposited onto the substrate and then etched to produce features at different depths for defining the anchoring structures 18, pillar structure 20, and other topographical features in the absorber element. If multiple sacrificial layers are used with different etch rates, the depth of the features can be defined by using the different layers of sacrificial materials as etch stops. In another embodiment, the use of photoresist materials and etching materials may be combined to produce the desired configuration of the absorber element. For example, a first layer of a material, such as Si, SiO2, or polymer, may be deposited onto the substrate with subsequent layers comprising photoresist.

Figure 2:
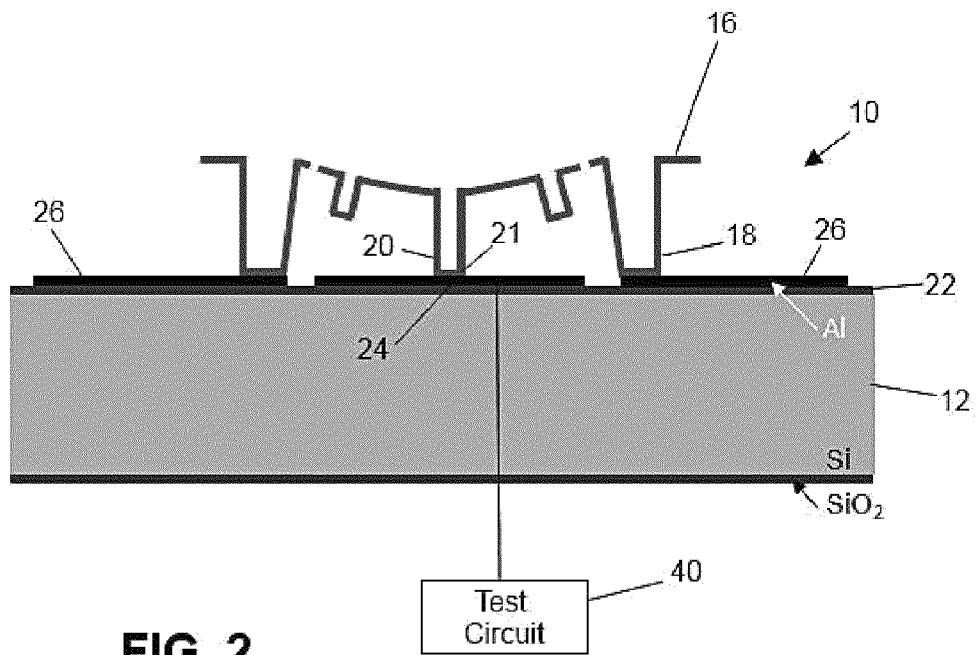
FIG. 2 is a cross-sectional view of the bolometer sensor of FIG. 1 showing the test circuit and the pillar structure of the absorber in contact with the substrate.

As depicted in FIG. 2, the pillar structure 20 of the absorber element 16 of the bolometer sensor is configured to be brought into contact with the electrode 24 on the surface of the substrate 12 to enable correlated double sampling of the output of the sensor. For example, a first sample of the sensor output is taken by passing a current through the absorber element and measuring the electrical resistance with the pillar structure 20 of the absorber element spaced apart from the substrate as depicted in FIG. 1 so that the absorber element 16 is under the influence of infrared radiation. The absorber element 16 is then actuated to bring the contact portion 21 of the pillar structure 20 into contact with the substrate 12 as depicted in FIG. 2 so that a second sample of the sensor output can be taken with the absorber element thermally shorted to the substrate (not shown).

One other possible operation scheme is to read out the sensor immediately after the absorber was thermally shorted with the substrate. If the time between thermal shorting and readout is significantly smaller than the thermal time constant, the infrared radiation will not have led to a temperature increase of the absorber. This way, two measurements with the same thermal properties, in particular the same influence of Joule heating, can be performed with and without the influence of thermal radiation. With the absorber element 16 thermally shorted to the substrate, the readout circuitry is actuated to pass a current through the absorber element so that the electrical resistance can be measured.

The absorber element is thermally shorted to the substrate by applying a test condition to the device. In one embodiment, the test condition comprises an actuation voltage between the absorber and substrate that is configured to induce an electrostatic charge which causes the absorber element to be attracted to and come into contact with the substrate. For example, as depicted in FIG. 2, test circuitry 40 may be electrically connected to the counter-electrode 24 and configured to selectively apply the actuation voltage to the counter-electrode 24. Alternatively, the absorber element may be shorted to the substrate thermally by coefficient of expansion mismatch in the suspension structure for the absorber such that the absorber element bends in response to the actuation voltage causing the pillar structure to come into contact with the substrate. Any other suitable actuation method may be used that is capable of causing the absorber element to be thermally shorted to the substrate.

By taking the difference between the measured signal before and after shorting, the off-set and drift of the sensor are reduced. For example, because the absorber element is thermally shorted to the substrate or was thermally shorted immediately before the measurement, the absorber element is not being influenced by infrared radiation. The difference between the first sample measurement and the second sample measurement therefore corresponds to the sensor response due to absorbed infrared radiation. Compensation values can then be incorporated into the calculation of the measured value to compensate for the difference so that offset can be reduced. In addition, double sampling of the sensor output may be periodically scheduled to detect drift so that drift can be reduced as well.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A semiconductor device comprising:
a substrate having an upper surface that defines a sensing region;
a patterned conductive layer provided on the upper surface, the patterned conductive layer including a first electrode structure located in the sensing region and readout conductors located around the sensing region;
an absorber structure suspended over the sensing region and spaced a first distance apart from the first electrode structure, the absorber structure including i) suspension structures extending upwardly from the substrate and being electrically connected to the readout conductors, and ii) a pillar structure extending downwardly from the absorber structure toward the first electrode structure, the pillar structure having a contact portion located a second distance apart from the first electrode structure, the second distance being less than the first distance; and
test circuitry electrically connected to the absorber structure, the test circuitry being configured to selectively apply an actuation voltage to the absorber structure,
wherein the absorber structure is configured to flex toward the substrate under a test condition,
wherein the second distance is selected such that the contact portion of the pillar structure is positioned in contact with the first electrode structure when the absorber structure is flexed in response to the test condition,
wherein the test condition comprises an actuation voltage being applied to the first electrode structure, and
wherein the second distance is selected such that the contact portion of the pillar structure is attracted to the first electrode structure by an electrostatic charge induced by the actuation voltage.

2. The device of claim 1, wherein the absorber structure forms a bolometer infrared sensor.

3. The device of claim 2, wherein the first electrode structure is configured to serve as a reflector for the absorber structure.

4. The device of claim 1, wherein the pillar structure is substantially centered in the absorber structure.

5. The device of claim 1, further comprising:
a sacrificial layer stack deposited on the patterned conductive layer, the sacrificial layer stack having an upper surface located at the first distance and being patterned to define anchor holes that extend down to the readout conductors on the upper surface of the substrate and to define a pillar hole that extends down from the upper surface to the second distance, and
wherein the absorber structure is formed of a conductive material that is deposited on the sacrificial layer stack to form the absorber structure, the conductive material lining walls in the anchor holes and the pillar hole to form the suspension structures, and the pillar structure, respectively.

6. The device of claim 5, wherein the conductive material is deposited using atomic layer deposition (ALD).

7. The device of claim 6, wherein the conductive material comprises platinum.

8. The device of claim 5, wherein the sacrificial layer stack includes a first sacrificial layer deposited on top of the patterned conductive layer, the first sacrificial layer having an upper surface located at the second distance, and
wherein the sacrificial layer stack includes at least one additional sacrificial layer deposited on top of the first sacrificial layer, the at least one additional sacrificial layer having an upper surface located at the first distance, the first sacrificial layer having a different etching characteristic than the at least one additional sacrificial layer.

9. The device of claim 8, wherein the at least one additional sacrificial layer comprises a second sacrificial layer deposited onto the first sacrificial layer and a third sacrificial layer deposited onto the second sacrificial layer, the second and the third sacrificial layers having different etching characteristics, the third sacrificial layer having the upper surface located at the first distance, the second sacrificial layer having an upper surface located at a third distance above the substrate, the third distance being less than the first distance and greater than the second distance,
wherein the third sacrificial layer is patterned to form trenches that extend down from the upper surface of the third sacrificial layer to the upper surface of the second sacrificial layer, and
wherein the first conductive material is deposited onto walls of the trenches to form mechanical stability features in the absorber structure.

10. A method of operating a semiconductor device, the method comprising:
measuring a first electrical resistance of an absorber structure of a bolometer device formed on a substrate, the absorber structure being suspended over an electrode structure provided on an upper surface of the substrate and spaced a first distance apart from the electrode structure, the absorber structure including i) suspension structures extending upwardly from the substrate and being electrically connected to readout conductors on the upper surface of the substrate, and ii) a pillar structure extending downwardly from the absorber structure toward the electrode structure, the pillar structure having a contact portion located a second distance apart from the first electrode structure, the second distance being less than the first distance, the absorber structure being configured to flex toward the substrate in response to a test condition, the second distance being selected such that the contact portion of the pillar structure is positioned in contact with the electrode structure when the absorber structure is flexed in response to the test condition, the first electrical resistance being measured with the contact portion of the pillar structure spaced apart from the electrode structure and indicating an output characteristic of the bolometer under influence of thermal radiation;
applying the test condition to the absorber structure after the first electrical resistance is measured to flex the absorber structure and bring the contact portion of the pillar structure into contact with the electrode structure;
measuring a second electrical resistance of the absorber structure while the contact portion of the pillar structure is contacting the electrode structure,
wherein the test condition comprises an actuation voltage being applied to the first electrode structure, and
wherein the second distance is selected such that the contact portion of the pillar structure is attracted to the first electrode structure by an electrostatic charge induced by the actuation voltage.

11. The method of claim 10, wherein the test condition comprises an actuation voltage being applied to the electrode structure, and
wherein the second distance is selected such that the contact portion of the pillar structure is attracted to the absorber structure by an electrostatic charge induced by the actuation voltage.

12. A method of fabricating a semiconductor device, the method comprising:
depositing a sacrificial layer stack over a patterned conductive layer provided on a surface of a substrate, the patterned conductive layer including an electrode structure, the sacrificial layer stack having an upper surface at a first distance above the electrode structure;
patterning the sacrificial layer stack to include anchor holes that extend down from the upper surface of the layer stack to the patterned conductive layer;
patterning the sacrificial layer stack to include a pillar hole that extends toward the electrode structure from the upper surface of the layer stack to a second distance apart from the electrode structure, the second distance being less than the first distance;
depositing a conductive material onto the sacrificial layer stack to form an absorber structure, the conductive material lining walls of the anchor holes to form suspension structures that support the absorber structure at the first distance and lining walls of the pillar hole to form a pillar structure, the pillar structure having a contact portion located at the second distance; and
configuring the absorber structure to flex toward the substrate in response to a test condition to bring the contact portion of the pillar structure into contact with the electrode structure,
wherein the test condition comprises an actuation voltage being applied to the first electrode structure, and
wherein the second distance is selected such that the contact portion of the pillar structure is attracted to the first electrode structure by an electrostatic charge induced by the actuation voltage.

13. The method of claim 12, further comprising:
removing the sacrificial layer stack to release the absorber structure.

14. The method of claim 12, wherein the conductive material is deposited using an atomic layer deposition (ALD) process.

15. The method of claim 14, wherein the conductive material comprises platinum.

16. The method of claim 11, wherein the sacrificial layer stack comprises at least one photoresist material.

17. The method of claim 11, wherein the sacrificial layer stack includes a first sacrificial layer deposited on top of the patterned conductive layer, the first sacrificial layer having an upper surface located at the second distance, and
wherein the sacrificial layer stack includes at least one additional sacrificial layer deposited on top of the first sacrificial layer, the at least one additional sacrificial layer having the upper surface located at the first distance, the first sacrificial layer having a different etching characteristic than the at least one additional sacrificial layer, and
wherein the pillar hole is formed by etching a trench through the at least one additional sacrificial layer and using the first sacrificial layer as an etch stop.

18. The method of claim 17, wherein the at least one additional sacrificial layer comprises a second sacrificial layer deposited onto the first sacrificial layer and a third sacrificial layer deposited onto the second sacrificial layer, the second and the third sacrificial layers having different etching characteristics, the third sacrificial layer having the upper surface located at the first distance, the second sacrificial layer having an upper surface located at a third distance above the electrode structure, the third distance being less than the first distance and greater than the second distance,
  wherein the third sacrificial layer is patterned to form trenches by etching down to the upper surface of the second sacrificial layer and using the second sacrificial layer as an etch stop, and
  wherein the first conductive material is deposited onto walls of the trenches to form mechanical stability features in the absorber structure.

* * * * *